United States Patent
Arndt et al.

(10) Patent No.: US 9,005,464 B2
(45) Date of Patent: Apr. 14, 2015

(54) TOOL FOR MANUFACTURING SEMICONDUCTOR STRUCTURES AND METHOD OF USE

(75) Inventors: Russell H. Arndt, Fishkill, NY (US); David F. Hilscher, Poughkeepsie, NY (US)

(73) Assignee: International Business Machines Corporation, Armonk, NY (US)

(*) Notice: Subject to any disclaimer, the term of this patent is extended or adjusted under 35 U.S.C. 154(b) by 502 days.

(21) Appl. No.: 13/169,418

(22) Filed: Jun. 27, 2011

(65) Prior Publication Data
US 2012/0326076 A1     Dec. 27, 2012

(51) Int. Cl.
| C03C 15/00 | (2006.01) |
| C03C 25/68 | (2006.01) |
| H01L 21/302 | (2006.01) |
| H01L 21/461 | (2006.01) |
| C09K 13/08 | (2006.01) |
| H01L 21/311 | (2006.01) |
| H01L 21/67 | (2006.01) |

(52) U.S. Cl.
CPC .......... *C09K 13/08* (2013.01); *H01L 21/31111* (2013.01); *H01L 21/67086* (2013.01)

(58) Field of Classification Search
None
See application file for complete search history.

(56) References Cited

U.S. PATENT DOCUMENTS

| 5,722,442 A | 3/1998 | Hoffman et al. |
| 5,868,855 A | 2/1999 | Fukazawa et al. |
| 5,972,123 A * | 10/1999 | Verhaverbeke ............ 134/3 |
| 6,037,271 A | 3/2000 | Carlson et al. |
| 6,235,145 B1 | 5/2001 | Li et al. |
| 6,350,425 B2 * | 2/2002 | Hoffman et al. ............ 423/470 |
| 6,378,534 B1 | 4/2002 | Olesen et al. |
| 6,799,589 B2 | 10/2004 | Inagaki |
| 7,469,883 B2 | 12/2008 | Verhaverbeke et al. |
| 7,875,557 B2 | 1/2011 | Matsuo et al. |
| 7,914,624 B2 | 3/2011 | Puri |
| 2002/0056700 A1* | 5/2002 | Ohmori ............ 216/84 |
| 2003/0094196 A1* | 5/2003 | Siefering et al. ............ 137/93 |
| 2004/0151062 A1 | 8/2004 | Yao et al. |
| 2004/0168710 A1 | 9/2004 | Lee et al. |
| 2010/0024847 A1 | 2/2010 | Breese et al. |
| 2010/0167514 A1 | 7/2010 | Kirkpatrick et al. |

FOREIGN PATENT DOCUMENTS

JP     2000031132     1/2000

OTHER PUBLICATIONS

O'Dougherty et al., "On-site blending and delivery of dilute HF with low metallic and particulate contamination to wafer cleaning and etching equipment in semiconductor fabs", Proceedings of the Semiconductor Pure Water and Chemicals Conference, 1994.

* cited by examiner

*Primary Examiner* — Nadine Norton
(74) *Attorney, Agent, or Firm* — Steven Meyers; Roberts, Mlotkowski, Safran & Cole, P.C.

(57) ABSTRACT

A tool and method is provided for mixing multiple components and feeding a single blend of the multiple components into the tool. The method includes adjusting a concentration of etchant solution. The method includes determining an etch target for each batch of wafers of a plurality of batches of wafers entering an etch chamber of a wafer processing tool. The method further includes adjusting a concentration of 40% $NH_4F$ to 49% HF for the each batch of wafers of the plurality of batches of wafers entering the wafer processing tool during a single run.

20 Claims, 1 Drawing Sheet

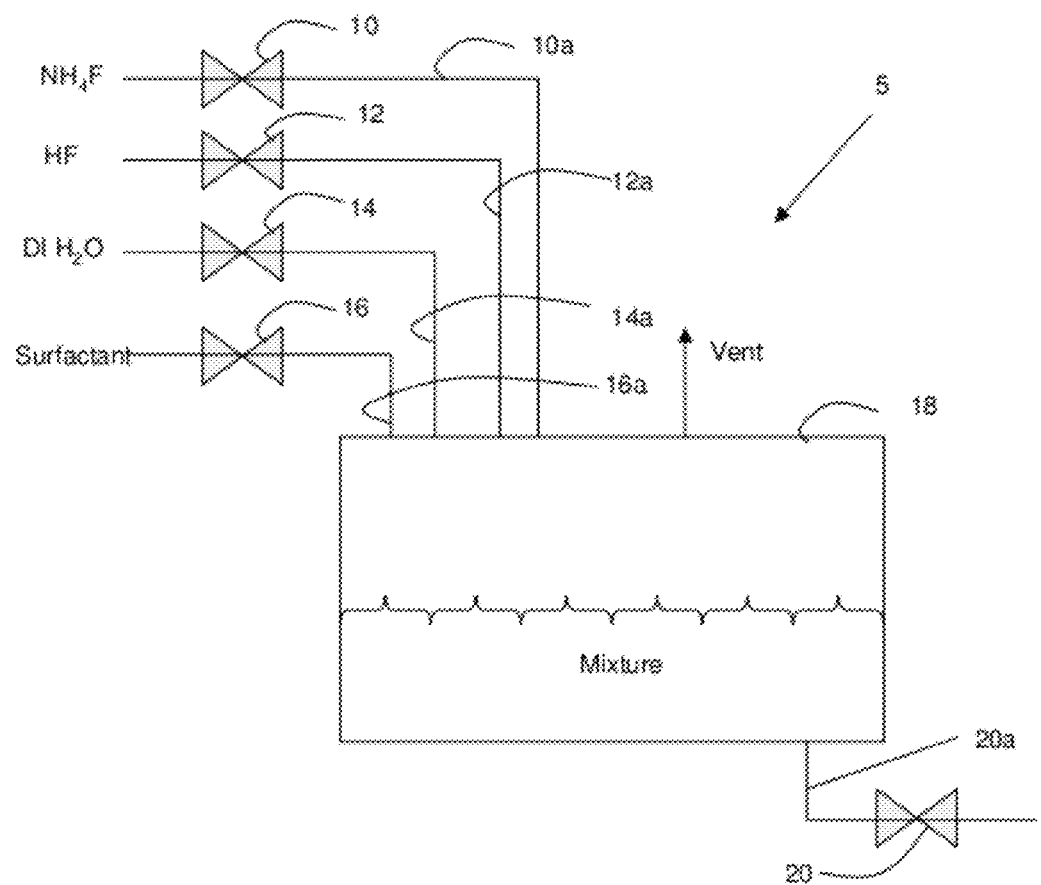

TOOL FOR MANUFACTURING SEMICONDUCTOR STRUCTURES AND METHOD OF USE

FIELD OF THE INVENTION

The invention relates to a tool for manufacturing semiconductor structures and, more particularly, to a tool for mixing multiple components and feeding a single blend of the multiple components into the tool, and method of use.

BACKGROUND

Typically wet tools have had a single concentration of buffered hydrofluoric acid (BHF) plumbed to the tools. Implementation of single wafer BHF at fixed concentration leads to significant volumes of waste for most recipes on the tool. This wastes expensive single wafer tool capacity and creates significant volumes of fluoride waste. High fluoride waste with single-use buffered HF on a single wafer tool also results in decreased throughput for all HF targets. This increases operating costs, since single wafer wet tooling are very expensive to operate.

Accordingly, there exists a need in the art to overcome the deficiencies and limitations described hereinabove.

SUMMARY

In a first aspect of the invention, a method of adjusting a concentration of etchant solution comprises determining an etch target for each batch of wafers of a plurality of batches of wafers entering an etch chamber of a wafer processing tool. The method further comprises adjusting a concentration of 40% $NH_4F$ to 49% HF for the each batch of wafers of the plurality of batches of wafers entering the wafer processing tool during a single run.

In another aspect of the invention, a method comprises, for each batch of wafers entering an etch chamber of a wafer processing tool, adjusting a concentration of 40% $NH_4F$ to 49% HF based on a smallest required etch target of a wafer associated with a current batch of wafers in the etch chamber of the processing tool. The adjusting comprises adjusting a mass flow controller of 40% $NH_4F$ for the tool and adjusting a mass flow controller of 49% HF for the tool.

In yet another aspect of the invention, a wafer processing tool comprises an etch chamber a first mass flow controller and a second mass flow controller. The first mass flow controller is configured to adjust a flow rate of 40% $NH_4F$ into the etch chamber for each batch of wafers of a plurality of batches of wafers over a single run, based on a smallest etch target of a wafer in the batch of wafers currently within the etch chamber. The second mass flow controller configured to adjust a flow rate of 49% HF into the etch chamber for the each batch of wafers of the plurality of batches of wafers over a single run, based on the smallest etch target of a wafer in a batch of wafers currently within the etch chamber.

BRIEF DESCRIPTION OF DRAWINGS

The present invention is described in the detailed description which follows, in reference to the noted plurality of drawings by way of non-limiting examples of exemplary embodiments of the present invention.

The FIGURE shows a wafer processing tool with multiple mass flow controllers in accordance with aspects of the present invention.

DETAILED DESCRIPTION

The invention relates to a tool for manufacturing semiconductor structures and, more particularly, to a tool for mixing multiple components for use in manufacturing semiconductor structures. In embodiments, the tool is configured to feed a different blend of multiple components (different recipes) into the tool for processing of semiconductor structures. For example, in embodiments, the tool comprises a chemical distribution system that is configured to mix 40% $NH_4F$ and 49% HF to create different concentrations of buffered HF (BHF), which are injected directly into the etch chamber of the tool. In embodiments, the distribution system can add de-ionized water and/or surfactant into the mixture of BHF to tune the recipe for different required processes. In embodiments, the surfactant can be glyercated organic species. As an example, the tool can run any number of BHF concentrations (e.g., 500:1, 40:1, etc.), as well as BHF solutions that are diluted with de-ionized water (e.g., 8 parts water:1 part (5:1 BHF) (8:5:1 BHF), for different semiconductor manufacturing processes, in a single run of a plurality of batches of wafers.

Advantageously, a single tool can now implement different BHF concentrations, to accommodate etchant recipes for various batches of wafers in a single run, thereby increasing tool throughput. This can be accomplished by adjusting mass flow controllers associated with different chemistries, i.e., 40% NH4F and 49% HF, depending on the particular batch of wafers that is entering the tool. Accordingly, the present invention allows the use of different recipes (BHF concentrations) for different wafer batches (in a single run) based on etching target rates. This is compared to a conventional tool which is only capable of using a single recipe of 40% NH4F and 49% HF, regardless of any particular requirements for a wafer batch. Also, the tool of the present invention can change its recipe, i.e., BHF concentration, during processing of a single batch of wafers within the tool. This provides the advantage of allowing the tool to etch, for example, an oxide material at a fast etch rate and then adjust the etchant mixture to ensure that the underlying substrate does not become roughened.

The FIGURE shows a wafer processing tool in accordance with aspects of the present invention. More specifically, the wafer processing tool 5 includes a plurality of mass flow controllers, i.e., valves 10, 12, 14 and 16. Specifically, the mass flow controller 10 is configured to adjust a flow rate of 40% $NH_4F$ into an etch chamber 18, flowing through pipe 10a. The mass flow controller 12 is configured to adjust a flow rate of 49% HF into the etch chamber 18, flowing through pipe 12a. The mass flow controller 14 is configured to adjust the flow rate of de-ionized (DI) water into the etch chamber 18, flowing through pipe 14a. The mass flow rate controller 16 is configured to adjust the flow rate of a surfactant such as glyercated organic species into the etch chamber 18, flowing through pipe 16a. An outlet pipe 20a and valve 20 are provided at an outlet of the etch chamber 18. The etch chamber 18 also includes a vent.

In embodiments, the mass flow controllers 10, 12, 14 and 16 adjust the concentration of chemistries (components) entering into the etch chamber 18 for different wafer batches in a single run. This can be accomplished by adjusting the flow controllers 10, 12, 14 and 16 based on desired semiconductor manufacturing processes. For example, adjustment of etch rates for individual wafer batches can be accomplished by tuning the flow rates of 40% $NH_4F$ and 49% HF, entering into the etch chamber 18. For example, the present invention can generate BHF mixtures with any desired concentration depending on the selection of the mass flow controllers. These concentrations, provided for illustrative purposes only, can be, for example:

- 40:1 BHF (40 parts 40% $NH_4F$ and 1 part 49% HF);
- 100:1 BHF (100 parts 40% $NH_4F$ and 1 part 49% HF);
- 500:1 BHF (500 parts 40% $NH_4F$ and 1 part 49% HF);
- 8:(5:1) BHF (8 parts DI water to 1 part of 5:1 BHF (5 parts 40% $NH_4F$ and 1 part 49% HF)); and/or
- (500:1 BHF with surfactant), 49% HF and water, using three separate feeds.

In embodiments, the present invention minimizes solution waste by tuning the recipe (concentration) for each wafer batch in a single run. This can be accomplished by determining an etch rate for each batch of wafers of a plurality of batches of wafers entering an etch chamber 18 of the wafer processing tool 5, and making the appropriate adjustment for each batch of wafers in a single run. So, for example, if a first batch has a wafer with an etch target of "X" Å and a second batch has a wafer with an etch target of "Y" Å (where "X" is less than "Y"), it is now possible to adjust the concentration of 40% $NH_4F$ to 49% HF, within a single tool, to accommodate both of the batches. Thus, compared to conventional tools, the present invention can adjust the amount of fluid required for particular etch rates amongst batches of wafers, thus significantly reducing fluid volume and etch target.

More specifically, Table 1 shows a batch of wafers with at least one wafer requiring a smallest etch target of 135 Å; whereas, Table 2 shows a batch of wafers with at least one wafer requiring a smallest etch target of 7 Å. In Table 1, a concentration of 40:1 BHF solution is used to accommodate the smallest etch rate of 135 Å; whereas, in Table 2, a concentration of 500:1 BHF solution is used to accommodate for the smallest etch target of 7 Å. In conventional tools, a concentration of 500:1 BHF solution would be required for both batches, so as to accommodate the smallest etch target of 7 Å. That is, using a concentration of 500:1 BHF in the batch of wafers in Table 2 would result in an appropriate etch target for the wafer requiring an etch target of 7 Å; whereas, using a concentration of 40:1 BHF in the batch of wafers in Table 2 would result in an over etch scenario for the wafer requiring an etch target of 7 Å. However, a considerable amount of solution is wasted for the wafers requiring an etch targets of 135 Å, 270 Å and 9600 Å, as shown by comparing the volume of solutions in Table 1 to Table 2.

TABLE 1

40:1 BHF EXAMPLE
(with minimum etch rate of 135 Å etch target)

| ETCH TARGET | VOLUME FLUORIDE WASTE |
| --- | --- |
| 135 Å etch target | 1 liter/wafer |
| 270 Å etch target | 2 liter/wafer |
| 9600 Å etch target | 71 liter/wafer |

TABLE 2

500:1 BHF EXAMPLE
(with minimum etch rate of 7 Å etch target)

| ETCH TARGET | VOLUME FLUORIDE WASTE |
| --- | --- |
| 7 Å etch target | 0.5 liter/wafer |
| 135 Å etch target | 9 liter/wafer |
| 270 Å etch target | 18 liter/wafer |
| 9600 Å etch target | 640 liter/wafer |

More specifically, as seen from the above tables, the use of a 500:1 BHF solution significantly increases the required volume of fluid for processing wafers, compared to a 40:1 BHF solution. However, as discussed above, in conventional tools the concentration of BHF solution for the batches of wafers noted in Tables 1 and 2 must be targeted to the smallest etch target, i.e., 7 Å etch target, so as to prevent over etching of such wafer. This, in turn, though, significantly increases the volume of waste fluid for the remaining batches being processed within the tool, as it is not possible to make any adjustments to the concentration of BHF solution between batches.

In comparison, the wafer processing tool 5 of the present invention can adjust the concentration of BHF solution between batches, and even during a single batch run. Accordingly, in the example of Tables 1 and 2, the wafer processing tool 5 can use a 40:1 BHF concentration for the batch of wafers in Table 1; whereas, the same wafer processing tool 5 can use a 500:1 BHF concentration for the batch of wafers in Table 2 during a same run. This will significantly reduce solution volumes which, in turn, will significantly save cost and etch times for the batch of wafers in Table 1.

By way of another example, the wafer processing tool 5 of the present invention can also significantly increase wafer throughput. More specifically, Tables 3 and 4 show etch times for the same wafers shown in Tables 1 and 2. In Table 3, a concentration of 40:1 BHF solution is used to accommodate the smallest etch target of 135 Å; whereas, in Table 4, a concentration of 500:1 BHF solution is used to accommodate the smallest etch target of 7 Å. As noted above, in conventional tools, a concentration of 500:1 BHF solution would be required for both batches, so as to accommodate the smallest etch target of 7 Å to prevent over etch of such wafer. However, a considerable amount of etch time is wasted using such conditions, for the wafers requiring etch targets of 135 Å, 270 Å and 9600 Å, as shown by comparing the volume of solutions in Table 3 to Table 4 for different BHF solutions.

TABLE 3

40:1 BHF EXAMPLE
(with minimum etch rate of 135 Å etch target)

| ETCH TARGET | ETCH RATE |
| --- | --- |
| 135 Å etch target | 1 Minute |
| 270 Å etch target | 2 Minutes |
| 9600 Å etch target | 71 Minutes |

TABLE 4

500:1 BHF EXAMPLE
(with minimum etch rate of 7 Å etch target)

| ETCH TARGET | ETCH RATE |
| --- | --- |
| 7 Å etch target | 30 seconds |
| 135 Å etch target | 9 Minutes |
| 270 Å etch target | 18 Minutes |
| 9600 Å etch target | 640 Minutes |

More specifically, as seen from the above tables, the use of a 500:1 BHF solution significantly increases the required etch time for processing wafers, compared to a 40:1 BHF solution. However, as discussed above, in conventional tools the concentration of BHF solution for the batches of wafers noted in Tables 3 and 4 must be targeted to the smallest etch target, i.e., 7 Å etch target, so as to prevent over etching of such wafer. This, in turn, though, significantly increases etch times for wafers requiring etch targets of 135 Å, 270 Å and 9600 Å, as shown by comparing the etch times in Table 3 to Table 4.

In comparison, the wafer processing tool 5 of the present invention can adjust the concentration of BHF solution between batches, and even during a single batch run. Accordingly, in the example of Tables 3 and 4, the wafer processing tool 5 can use a 40:1 BHF concentration for the batch of wafers in Table 3; whereas, the same wafer processing tool 5 can use a 500:1 BHF concentration for the batch of wafers in Table 4. This will significantly reduce etch times for wafers requiring etch targets of 135 Å, 270 Å and 9600 Å, thus significantly increasing wafer processing throughput and hence decreasing fabrication cost.

In further embodiments, the wafer processing tool 5 can vary the concentration of BHF solution during a single batch processing stage. For example, the concentration of BHF solution can be adjusted during the etching of an interfacial layer. By way of example, in replacement metal gate technologies, a first concentration of BHF solution can be used for etching of the interfacial layer to a depth of about 10 Å to about 20 Å. The concentration of the BHF solution can then be diluted for etching of the remaining interfacial layer. The diluted concentration would lessen the likelihood of the etch solution roughening the underlying surface.

By way of a more specific example, the wafer processing tool 5 can be adjusted to provide a 500:1 BHF solution, to etch the interfacial layer to about 10 Å to about 20 Å. As the interfacial layer is being etched nearer to the underlying substrate, the wafer processing tool 5 can dilute the BHF solution with DI water to 8:5:1. This concentration, although still selective, will lessen the risk of roughening the surface of the underlying substrate. Also, the dilute solution will also maintain a selectivity improvement over conventional dilute HF (DHF) solutions.

In another example, the wafer processing tool 5 can feed forward from a shallow trench isolation (STI) structure to HF deglaze. That is, the single wafer processing tool 5 can adjust the time for each etch target over a narrow range to support step height improvement in certain technologies (e.g., replacement metal gate technologies). More specifically, the wafer processing tool 5 can adjust the concentration of BHF solutions during an STI polish, to eliminate any oxide residues. That is, for the STI polish, lower concentration of BHF solution can be used to remove the bulk of the oxide, and any residual oxide can be removed with a higher ratio of $NH_4F$. The high concentration of $NH_4F$ will ensure that the underlying material is not over etched.

In a further example, the wafer processing tool can also adjust concentrations of the surfactant. By way of example, as should be known to those of skill in the art, surfactants are compounds that lower the surface tension of a liquid, the interfacial tension between two liquids, or that between a liquid and a solid. Surfactants may act as wetting agents, for example. Hole permeability of the BHF solution can be adjusted by tuning the amount of surfactant used in the wafer processing tool 5, i.e., etch chamber 18. It should be understood by those of skill in the art that surfactant can include typical fluorohydrocarbons which are typical in BHF solutions, as well as certain organic chemicals such as glycerin which also has the same effect of lowering the surface tension of the solution.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method of adjusting a concentration of etchant solution comprising:

determining an etch target for each batch of wafers of a plurality of batches of wafers entering an etch chamber of a wafer processing tool; and adjusting a concentration of 40% NH4F to 49% HF in the wafer processing tool for the each batch of wafers of the plurality of batches of wafers entering the wafer processing tool based on the determined etch target for each batch of wafers, wherein:

each batch of wafers enters the wafer processing tool during a single run of the wafer processing tool;

each batch of wafers includes a plurality of wafers;

the determining comprises:

determining that a wafer of a first batch of the plurality of batches of wafers has a first etch target which is a smallest etch target of the plurality of wafers included in the first batch, and determining that a wafer of a second batch of the plurality of batches of wafers has a second etch target which is a smallest etch target of the plurality of wafers included in the second batch; and the adjusting comprises:
for the first batch, adjusting the concentration of the 40% NH4F to 49% HF to a first predetermined concentration corresponding to the first etch target, and
for the second batch, adjusting the concentration of the 40% NH4F to 49% HF to a second predetermined concentration corresponding to the second etch target.

2. The method of claim 1, wherein:
the adjusting for the first batch is based on the smallest etch target of the plurality of wafers included in the first batch; and
the adjusting for the second batch is based on the smallest etch target of the plurality of wafers included in the second batch.

3. The method of claim 1, wherein:
the adjusting for the first batch comprises:
adjusting a mass flow controller of 40% NH4F for the wafer processing tool, based on the smallest required etch target of the plurality of wafers included in the first batch; and
adjusting a mass flow controller of 49% HF for the wafer processing tool, based on the smallest required etch target of the plurality of wafers included in the first batch; and
the adjusting for the second batch comprises:
adjusting the mass flow controller of 40% NH4F for the wafer processing tool, based on the smallest required etch target of the plurality of wafers included in the second batch; and
adjusting the mass flow controller of 49% HF for the wafer processing tool, based on the smallest required etch target of the plurality of wafers included in the second batch.

4. The method of claim 1, wherein the adjusting the concentration of 40% NH4F to 49% HF in the wafer processing tool for the each batch of wafers comprises providing at least one of 40:1, 100:1 and 500:1 ratio of 40% NH4F to 49% HF.

5. The method of claim 1, wherein the adjusting comprises diluting the concentration of 40% NH4F to 49% HF with de-ionized water.

6. The method of claim 5, wherein the diluting comprises adjusting a mass flow rate of the de-ionized water.

7. The method of claim 5, wherein the diluting occurs during etching a first portion of a particular layer of the first batch, the diluting lessening the likelihood of roughening an underlying surface of a second portion of the particular layer by the etching.

8. The method of claim 7, wherein:
the particular layer is an interfacial layer; and
the diluting occurs after etching of the first portion of the interfacial layer to a certain depth.

9. The method of claim 5, further comprising mixing surfactant with the concentration of 40% NH4F to 49% HF.

10. The method of claim 1, wherein the adjusting comprises mixing surfactant with the concentration of 40% NH4F to 49% HF.

11. The method of claim 1, wherein the adjusting for the each batch of wafers comprises:
adjusting the concentration of 40% NH4F to 49% HF in the wafer processing tool between the first batch and the second batch; and
adjusting the concentration of 40% NH4F to 49% HF in the wafer processing tool during the first batch.

12. The method of claim 11, wherein the adjusting the concentration of 40% NH4F to 49% HF between the first batch and the second batch comprises adjusting the concentration based on the smallest etch target of the plurality of wafers included in the first batch and the smallest etch target of the plurality of wafers included in the second batch.

13. The method of claim 1, wherein the adjusted concentration of 40% NH4F to 49% HF of the second batch is a different ratio of the 40% NH4F to the 49% HF than the first batch, wherein the different ratio is obtained by tuning at least one of: 40% NH4F entering the wafer processing tool, and 49% HF entering the wafer processing tool.

14. The method of claim 13, wherein the ratio of the 40% NH4F to the 49% HF in the first batch and in the second batch is between 40:1 and 500:1.

15. A method comprising:
for each batch of wafers of a plurality of batches of wafers entering an etch chamber of a wafer processing tool:
determining that a wafer of a current batch of the plurality of batches of wafers has an etch target which is a smallest etch target of a plurality of wafers included in the current batch; and
adjusting a concentration of 40% NH4F to 49% HF for the current batch, the adjusted concentration corresponding to the determined etch target of the wafer which is the smallest etch target of the plurality of wafers, the adjusting comprising:
adjusting a mass flow controller of 40% NH4F for the tool; and
adjusting a mass flow controller of 49% HF for the tool.

16. The method of claim 15, wherein the adjusting comprises diluting the concentration of 40% NH4F to 49% HF with de-ionized water.

17. The method of claim 16, wherein the diluting occurs during etching a first portion of a particular layer of a single batch of wafers within the etch chamber of the wafer processing tool, the diluting lessening the likelihood of roughening an underlying surface of a second portion of the particular layer by the etching.

18. The method of claim 17, wherein:
the particular layer is an interfacial layer; and
the diluting occurs after etching of the first portion of the interfacial layer to a certain depth.

19. The method of claim 18, wherein the adjusting comprises adjusting a mixture of surfactant with the concentration of 40% NH4F to 49% HF.

20. The method of claim 15, wherein the adjusting comprising at least one of 40:1, 100:1 and 500:1 ratio of 40% NH4F to 49% HF for different batches of wafers of the plurality of batches of wafers.

* * * * *